United States Patent [19]

Hirahara et al.

[11] Patent Number: 5,424,734
[45] Date of Patent: Jun. 13, 1995

[54] VARIABLE LOGIC OPERATION APPARATUS

[75] Inventors: Kioto Hirahara; Hidetoshi Matsuoka; Koichiro Takayama; Shintaro Shimogori; Fumiyasu Hirose, all of Kawasaki, Japan

[73] Assignee: Fujitsu Limited, Kawasaki, Japan

[21] Appl. No.: 202,175

[22] Filed: Feb. 25, 1994

[30] Foreign Application Priority Data

Apr. 28, 1993 [JP] Japan .................................. 5-102657

[51] Int. Cl.6 ............................................. H03M 7/00
[52] U.S. Cl. ..................................................... 341/79
[58] Field of Search ...................... 341/78, 79, 88, 57, 341/51; 364/489; 307/465

[56] References Cited

U.S. PATENT DOCUMENTS 4,177,455 12/1979 Armstrong et al. ................... 341/78

Primary Examiner—Brian K. Young
Attorney, Agent, or Firm—Staas & Halsey

[57] ABSTRACT

A variable logic operation apparatus which receives n-nary input data, logic function setting data and connection data, and performs logic operations on the input data based on a logic expression. The apparatus includes a plurality of logic operation units, each logic operation unit selecting a respective logic operation from a group of at least one logic operation, and outputting a single result based on the selected logic operation. The selected logic operation is selected by the logic function setting data. A plurality of connection devices connect the plurality of logic operation units in accordance with the connection data to form a tree structure. The tree structure is changeable by changing the connection data. Thus, the logic expression is converted into the tree structure in accordance with the setting data and the connection data.

22 Claims, 20 Drawing Sheets

LOGIC OPERATION UNIT

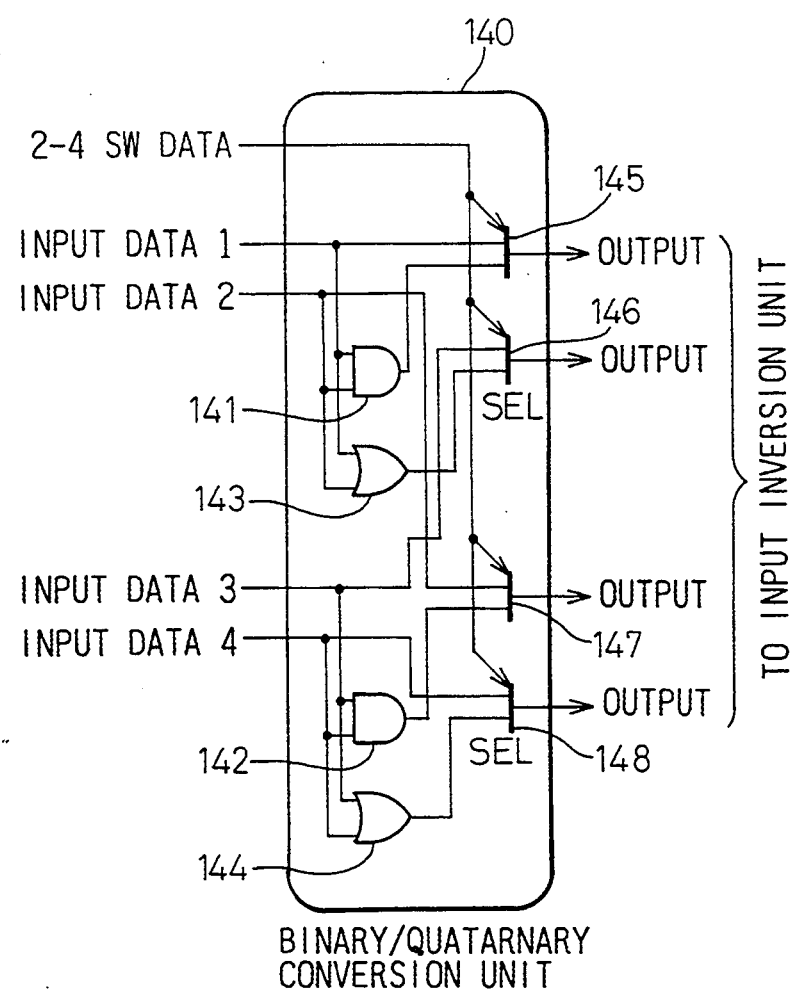

| X1X0 | B1B0 | | | LOGIC VALUE IS TWO BITs "0"=00 "1"=11 "X"=01 |
|---|---|---|---|---|
| A1A0 | | 0 | 1 | X |
| | 0 | 0 | 0 | 0 |
| | 1 | 0 | 1 | X |
| | X | 0 | X | X |

| Y1Y0 | B1B0 | | | LOGIC VALUE IS TWO BITs "0"=00 "1"=11 "X"=01 |
|---|---|---|---|---|
| A1A0 | | 0 | 1 | X |
| | 0 | 0 | 1 | X |
| | 1 | 1 | 1 | 1 |
| | X | X | 1 | X |

| X | B | | LOGIC VALUE IS ONE BIT |
|---|---|---|---|
| A | | 0 | 1 |
| | 0 | 0 | 0 |
| | 1 | 0 | 1 |

| Y | B | | LOGIC VALUE IS ONE BIT |
|---|---|---|---|
| A | | 0 | 1 |
| | 0 | 0 | 1 |
| | 1 | 0 | 1 |

VARIABLE LOGIC OPERATION APPARATUS

BACKGROUND OF THE INVENTION

1. Field of the Invention

The present invention relates to a variable logic operation apparatus and, more particularly, it relates to a variable logic operation apparatus for performing logic operation based on a predetermined logic expression which is given from an external stage (for example, a user). In this case, n-nary input data, preferably, binary, ternary, or quaternary are used as operation input data to this apparatus.

2. Description of the Related Art

In a design process of a VLSI (Very Large Scale Integrated) circuit, a logic simulation apparatus is usually used for confirming whether or not a designed logic circuit operates normally in accordance with a specification. Accordingly, it is required that the logic simulation apparatus executes various logic operations at high speed.

There are three kinds of known methods for performing a logic operation, i.e., an operator method, a truth value method, and an FPGA (Field Programmable Gate Array) method.

As explained in detail hereinafter, the main differences among these methods are as follows. That is, in the operator method, each logic (i.e., AND, OR, etc.) of the logic expression is separately processed in a logic operation unit. In the truth value method, the logic expression is processed collectively in the logic operation unit. In the FPGA method, the logic expression is processed by using a programmable logic circuit. There are, however, various problems in these known three methods as explained in detail hereinafter.

SUMMARY OF THE INVENTION

The object of the present invention is to provide a variable logic operation apparatus in which it is possible to easily provide a logic expression having a tree structure and to realize high speed logic operation by collectively processing the logic expression.

In accordance with the present invention, there is provided a variable logic operation apparatus for inputting n-nary input data, preferably, binary, ternary or quaternary input data, and for performing logic operation of the input data based on a logic expression, the apparatus including:

a plurality of logic operation units each of which performs the logic operation defined by a logic function setting data which is applied from an external stage; and a plurality of connection units each of which is provided for connecting each logic operation means so as to provide a tree structure, and the tree structure being changable in accordance with a connection data which is applied from the external stage;

wherein the logic expression is converted to the tree structure in accordance with the setting data and the connection data to perform the logic operation.

In one preferred embodiment, the connections among the logic operation units are previously limited, and only necessary connections are changed by using the connection data.

In another preferred embodiment, the logic operation units are connected so as to form the tree structure which is previously fixed, and one or more outputs of the logic operation units are selected to obtain a desired result of the logic expression in accordance with the connection data.

In still another preferred embodiment, the logic function setting data is separately applied to each logic operation means so that the logic function of each logic operation unit is separately set in accordance with the setting data.

In still another preferred embodiment, the logic function setting data is applied for every level of the tree structure so that the logic function of each logic operation unit is set for every level of the tree structure in accordance with the setting data.

In still another preferred embodiment, the variable logic operation apparatus further comprises an input inversion unit which is provided for an input stage of the logic operation unit for inverting the input data in accordance with an input inverting/switching data which is applied from the external stage.

In still another preferred embodiment, the variable logic operation apparatus further comprises a binary/quaternary conversion unit which is provided for an input stage of the logic operation unit for converting the input data between the binary and quaternary in accordance with a binary/quaternary switching data which is applied from the external stage.

In still another preferred embodiment, the binary/quaternary conversion unit comprises plural sets of a binary conversion unit and a quaternary conversion unit, and each set of two units corresponds to the input data.

In still another preferred embodiment, the logic operation unit comprises two binary logic operation units which are doubled.

In still another preferred embodiment, the logic operation unit comprises a binary operation unit and a quaternary operation unit.

In still another preferred embodiment, the variable logic operation apparatus further comprises a binary/quaternary conversion unit and an input inversion unit; the binary/quaternary conversion unit for converting the input data between the binary and quaternary in accordance with binary/quaternary switching data which is applied from the external stage; and the input inversion unit which is provided between the binary/quaternary conversion means and input stage of the logic operation unit for inverting the output data from the binary/quaternary conversion unit in accordance with input inverting/switching data which is applied from the external stage.

In still another preferred embodiment, the logic operation unit comprises plural sets of an AND gate, an OR gate, and a selection unit; each set receives the input data; and the selection unit selects either the AND gate or the OR gate in accordance with the setting data.

In still another preferred embodiment, the input inversion unit comprises plural sets of an invertor and a selector; each set receives the input data; and each selection unit selects either the direct input data or the input data inverted by the invertor in accordance with the input inversion data.

In still another preferred embodiment, the binary/quaternary conversion unit comprises plural sets of a binary input conversion unit, a quaternary input conversion unit, and a selection unit; each set receives the input data; and the selection unit selects either the binary input conversion unit or the quaternary input conversion unit in accordance with the binary/quaternary switching data.

In still another preferred embodiment, the logic operation unit comprises a binary operation unit, a quaternary operation unit and a selector; and the selector selects either the binary operation unit, or the quaternary operation unit in accordance with a binary/quaternary switching data which is input from the external stage.

In still another preferred embodiment, the logic operation unit comprises a binary input conversion unit, a quaternary input conversion unit, a selector, and a set of binary logic operation units which is doubled; the input data is provided to the binary input conversion unit and the quaternary input conversion unit, the selector selects either the binary input conversion unit or the quaternary input conversion unit; and the input selected by the selector is provided to said set.

BRIEF EXPLANATION OF THE DRAWINGS

In the drawings:

FIG. 18 shows one embodiment of the binary/quaternary conversion unit;

DESCRIPTION OF THE PREFERRED EMBODIMENTS

Before describing the preferred embodiments, a conventional art and its problem will be explained in detail below.

Figure 1:
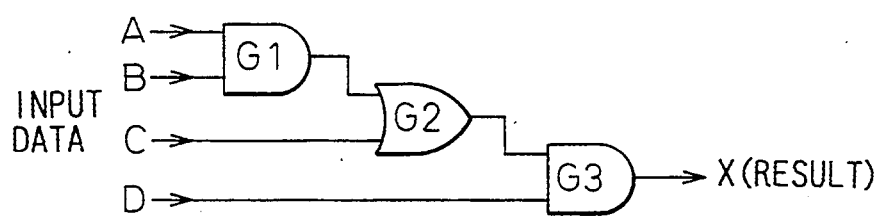
FIG. 1 shows one model of a logic circuit.

FIG. 1 shows one model of a logic circuit. There are three kinds of known methods, i.e., an operator method, a truth value method, and an FPGA method, and these methods are explained with reference to FIGS. 2 to 4 based on the logic circuit shown in FIG. 1.

In FIG. 1, references A to D are input data, and X is a result of the logic operation. Reference G1 to G3 are operation logic circuits which consist of two AND gates (G1 and G3) and one OR gate (G2).

This logic circuit uses the following logic expression.

$$X = ((A \cdot B) + C) \cdot D \quad (1)$$

Figure 2:
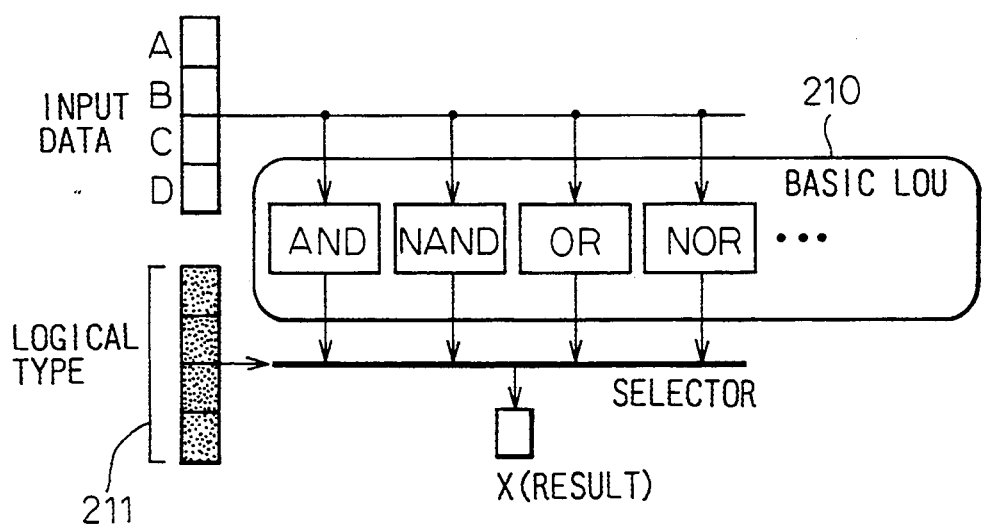
FIG. 2 is a schematic block diagram of a conventional operator method.

FIG. 2 is a schematic block diagram of the operator method. In FIG. 2, reference number 210 denotes a basic logic operation unit (BASIC LOU), and reference number 211 denotes a logical type which indicates the logic structure and is applied from the external stage. The input data A to D are applied in parallel to the basic logic operation unit 210, and the result of the basic logic operation unit 210 is selected by a selector in accordance with the logical type 211. The logic expression (1) is divided into an individual logic operation to operate each logic. That is, the first logic operation is performed on the input data A and B by the operation logic G1. The next logic operation is performed on the result of the logic G1 and the input data C by the operation logic G2. The third logic operation is performed to the result of the logic G2 and the input data D by the operation logic G3. As a result, the operation logic G3 provides the output X as the result from the logic expression (1).

According to this method, the logic structure is simplified as shown in the drawing. However, since each logic operation, i.e., AND and OR logic operation, is processed separately, a lot of time is required for obtaining the result of the logic expression if many steps are contained in the logic expression.

Figure 3:
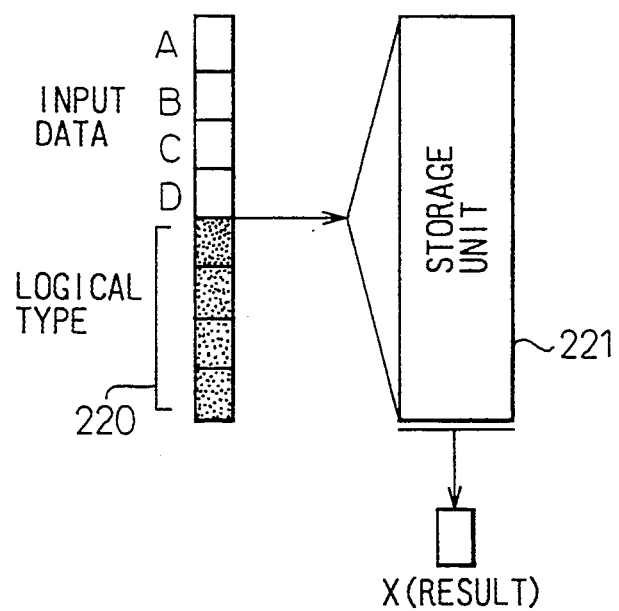
FIG. 3 is a schematic block diagram of a conventional truth value method.

FIG. 3 is a schematic block diagram of a truth table method. In FIG. 3, reference number 220 denotes the logical type, and reference number 221 denotes a storage unit. In this method, an address of each input data is generated from the input data A to D and the logical type 220. The storage unit 211 previously stores the result of operation of the logic expression (1) for every address. Accordingly, the result X of the logic expression (1) corresponds to each address.

According to this method, it is possible to collectively process the logic operation and easily handle the n-nary input data. However, it is necessary to provide various truth tables each corresponding to different logic expression so that it is necessary to provide a number of storage areas each corresponding to a truth table.

Figure 4:
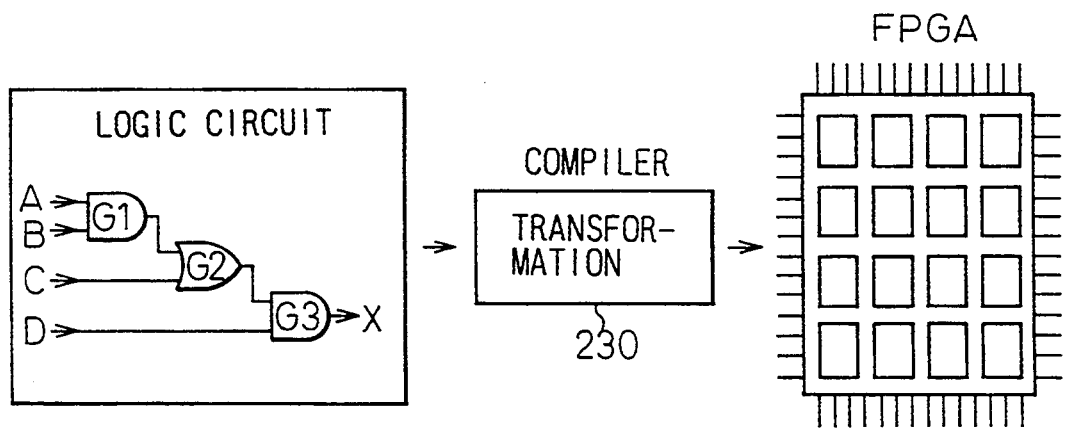
FIG. 4 is a schematic block diagram of a conventional FPGA method.

FIG. 4 is a schematic block diagram of an FPGA method. In FIG. 4, reference number 230 denotes a compiler for converting data of the logic expression in order to map the data on the FPGA (field programmable gate array) which is a programmable logic circuit. Accordingly, the logic circuit shown in FIG. 1 is mapped on the FPGA through the compiler 230 so that it is possible to operate the logic expression (1).

According to this method, it is possible to collectively process the logic expression. Further, it is possible to realize high speed operation since this method is performed by hardware. Further, it is not necessary to provide the truth table of FIG. 3. However, since each logic expression is mapped on the FPGA, it is necessary to provide a number of storage areas on the FPGA when various logic expressions must be processed. Further, a cost of the FPGA is considerably higher than that of the storage unit of FIG. 3. Still further, a lot of time is required for compiling the logic expression in the compiler 230.

Accordingly, the present invention aims to provide an improved variable logic operation apparatus in which it is possible to easily execute setting of a logic expression having a tree structure and to collectively process various logic operations at high speed.

Figure 5:
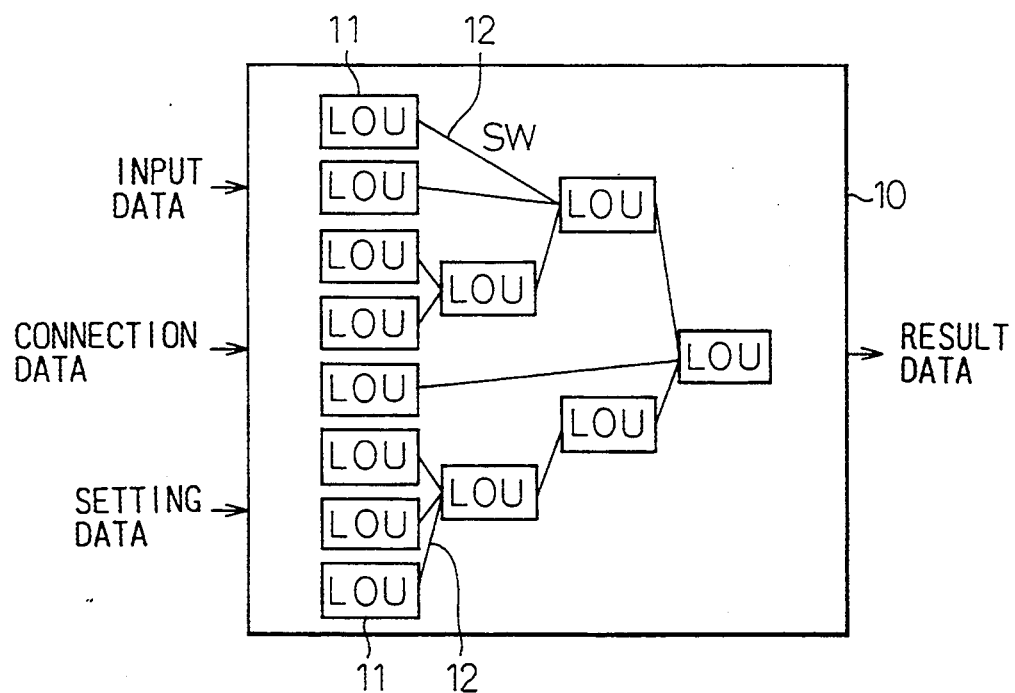
FIG. 5 is a basic structure of a variable logic operation apparatus according to the present invention.

FIG. 5 is a basic structure of a variable logic operation apparatus according to the present invention.

The variable logic operation apparatus 10 includes a plurality of logic operation units (LOU) 11 each of which is connected by a connection switch (SW) 12 so as to provide a tree structure. Each logic operation unit 11 performs the logic operation which is defined by a logical function setting data (below, setting data) applied from an external stage. Each connection switch 12 is provided for setting connection configuration of the logic operation unit 11 in accordance with a logic operation connection data (below, connection data) applied from the external stage. The variable logic operation apparatus 10 performs the logic operation of the input data based on the logic expression which is converted to the tree structure in accordance with the setting data and the connection data, and outputs the result of the logic operation.

In this structure, it is possible to reduce the number of connection data, which is applied from the external stage in order to change the tree structure, by limiting the number of the input LOUs to the number of the output of other LOUs which are previously determined. That is, the connections among the logic operation units are previously limited, and all necessary connections are changed in accordance with the connection data of the logic operation unit.

Figure 6A:
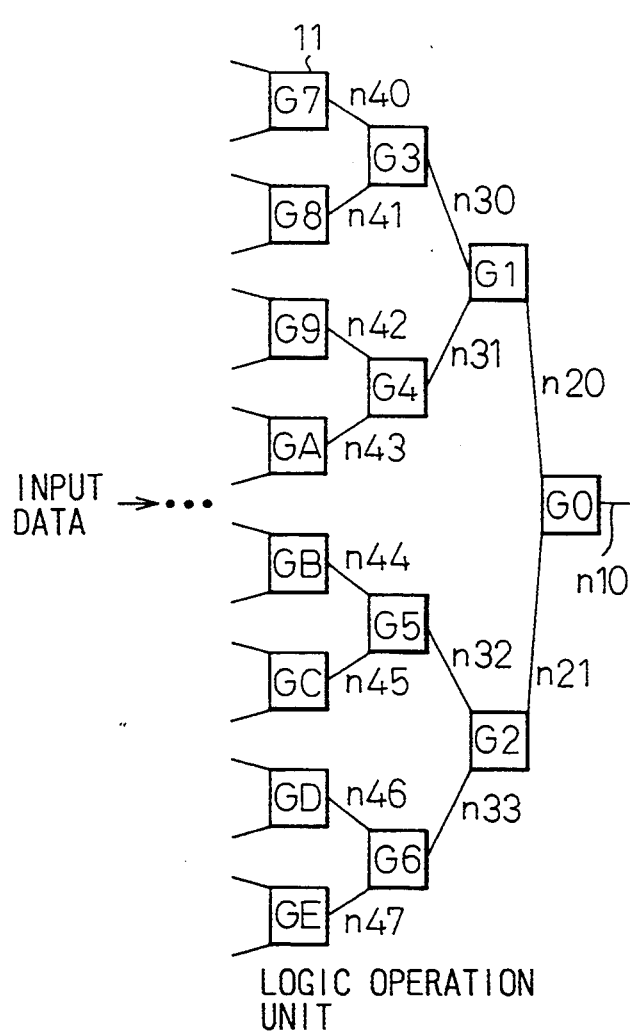
FIGS. 6A and 6B are explanatory views for an operation method which selects outputs of logic operation units in the case that connections are fixed.
Figure 6B:
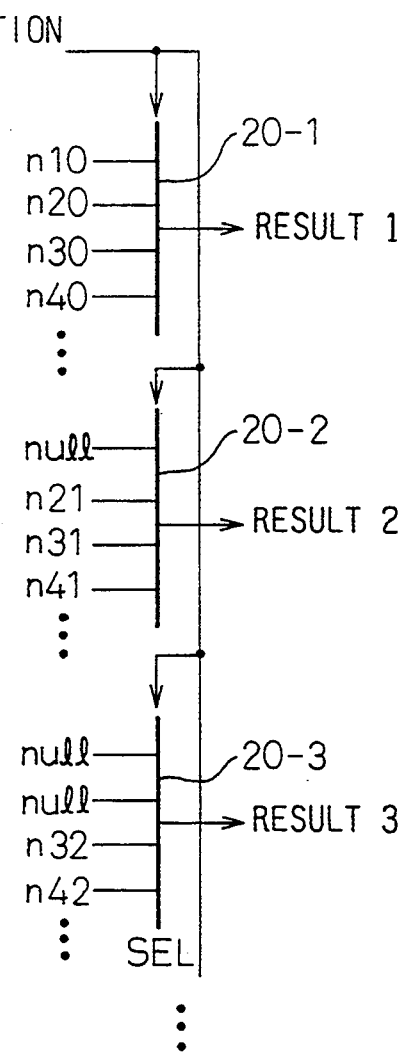

FIGS. 6A and 6B are explanatory views for an operation method which selects outputs of the logic operation units in which the connections are fixed. In FIG. 6A, all logic operation units G0 to GE are connected to the tree structure which is previously fixed, and the result of logic operation is output from the designated logic operation unit 11. As shown in FIG. 6B, the selection circuits (SEL) 20 are selected by the connection data. Outputs n10 to n47 from logic operation units G0 to GE in FIG. 6A correspond to that of FIG. 6B. For example, the first selector 20-1 sequentially selects any one of outputs n10 to n40, and outputs the result data (RESULT 1). In second selector 20-2, when the "null" is selected, the valid data is not output from the selector.

Figure 7:
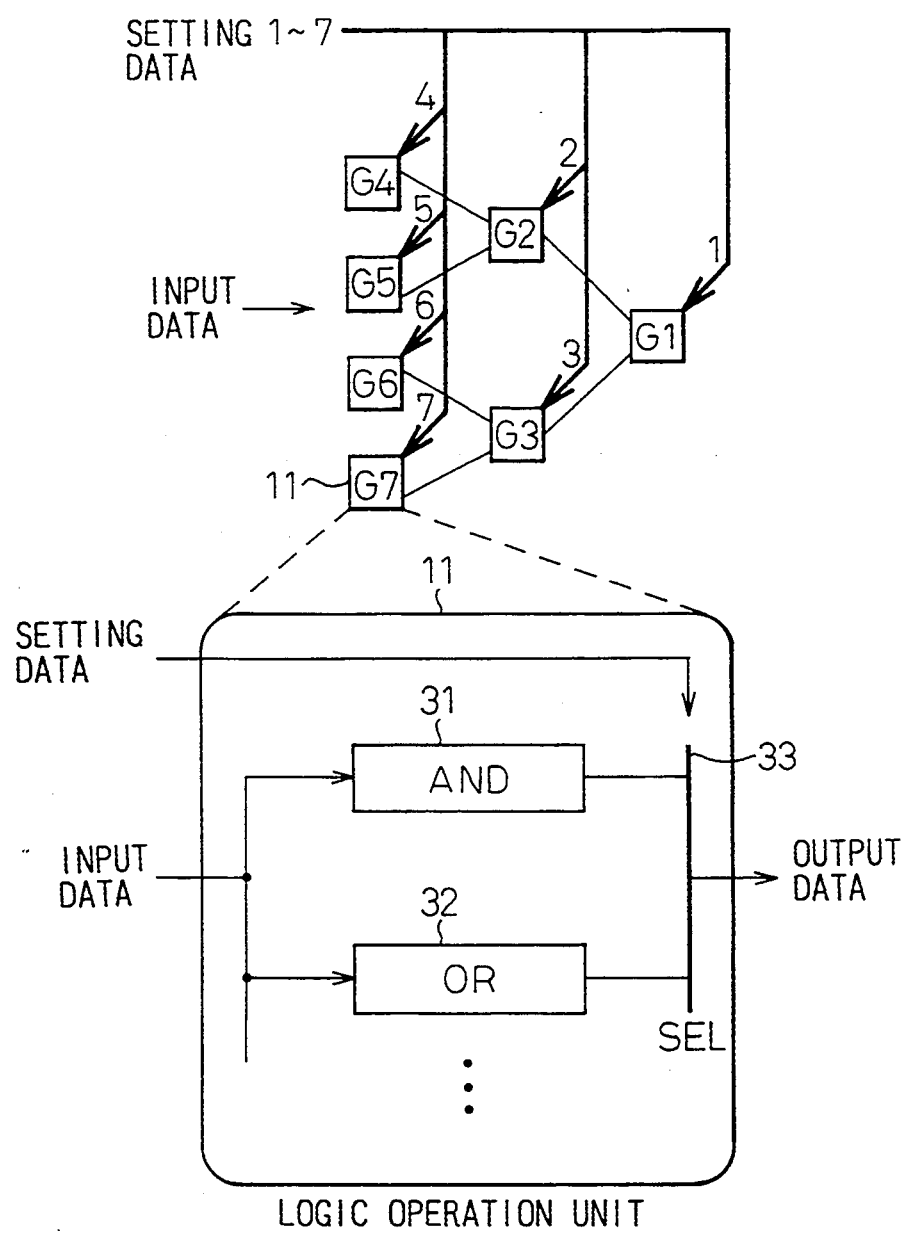
FIG. 7 shows one example of a basic structure of the logic operation unit shown in FIG. 5.

FIG. 7 shows one example of a basic structure of the logic operation unit. As shown by the drawing, each of setting data 1 to 7 is applied to corresponding logic operation unit 1 to 7. As shown by an enlarged view, the logic operation unit 11 is formed of an AND circuit 31, an OR circuit 32, a selector (SEL) 33, and other logic circuits (not shown). The input data are applied to the AND circuit 31 and the OR circuit 32, and the outputs of these circuits are selected by the setting data, for example, the setting data 7, in the selector (SEL) 33. Accordingly, it is possible to separately provide the logic function of each logic operation unit.

Figure 8:
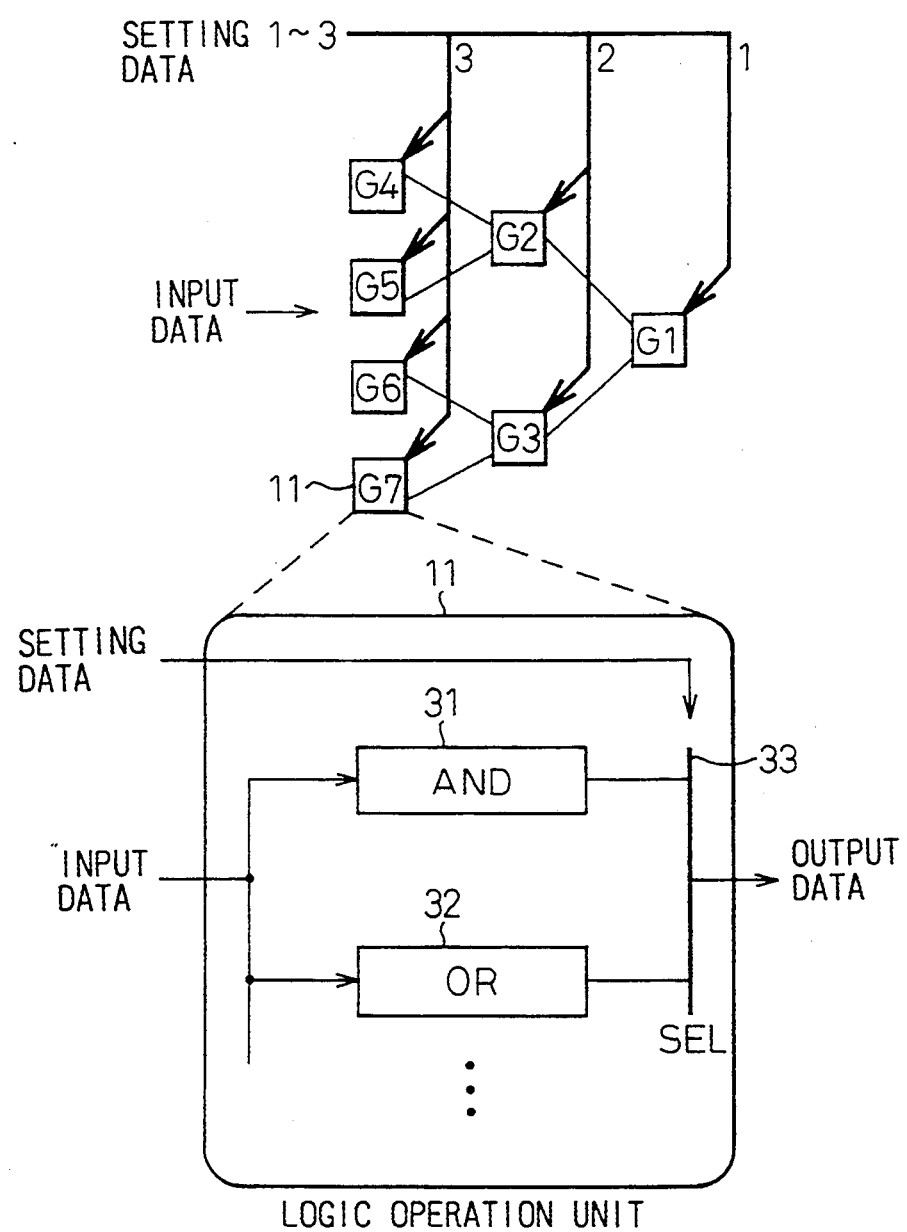
FIG. 8 shows another example of a basic structure of the logic operation unit shown in FIG. 5.

FIG. 8 shows another example of a basic structure of the logic operation unit. In this example, the setting data 1 to 3 are applied to each level of the tree structure. That is, the setting data 1 is applied to the logic operation unit G1, the setting data 2 is applied to the logic operation units G2 and G3, and the setting data 3 is applied to the logic operation units G4 to G7.

Figure 9:
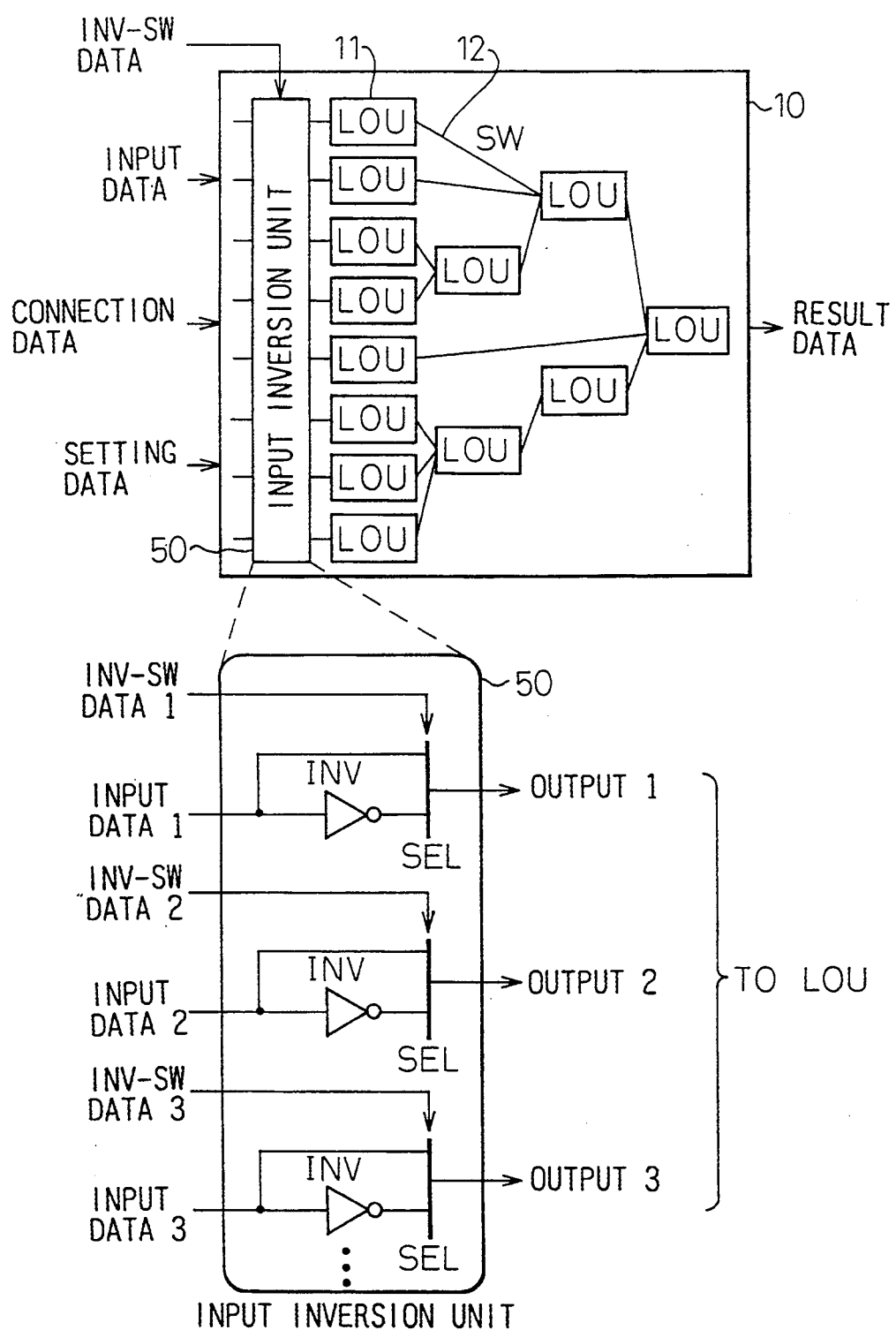
FIG. 9 shows one example of a basic structure of an input inversion unit provided for a first stage of the logic operation unit shown in FIG. 5.

FIG. 9 is a basic structure of an input inversion unit which is provided for a first stage of the logic operation unit. Reference number 50 denotes an input inversion unit which inverts the input data. As shown by an enlarged view 50, the input inversion unit 50 is formed of a plurality of invertors INV and corresponding selectors SEL. Each input data is provided to either the invertor INV or the selector, switched by the input inversion switching data (INV-SW DATA), and output to the corresponding logic operation unit 11.

Figure 10:
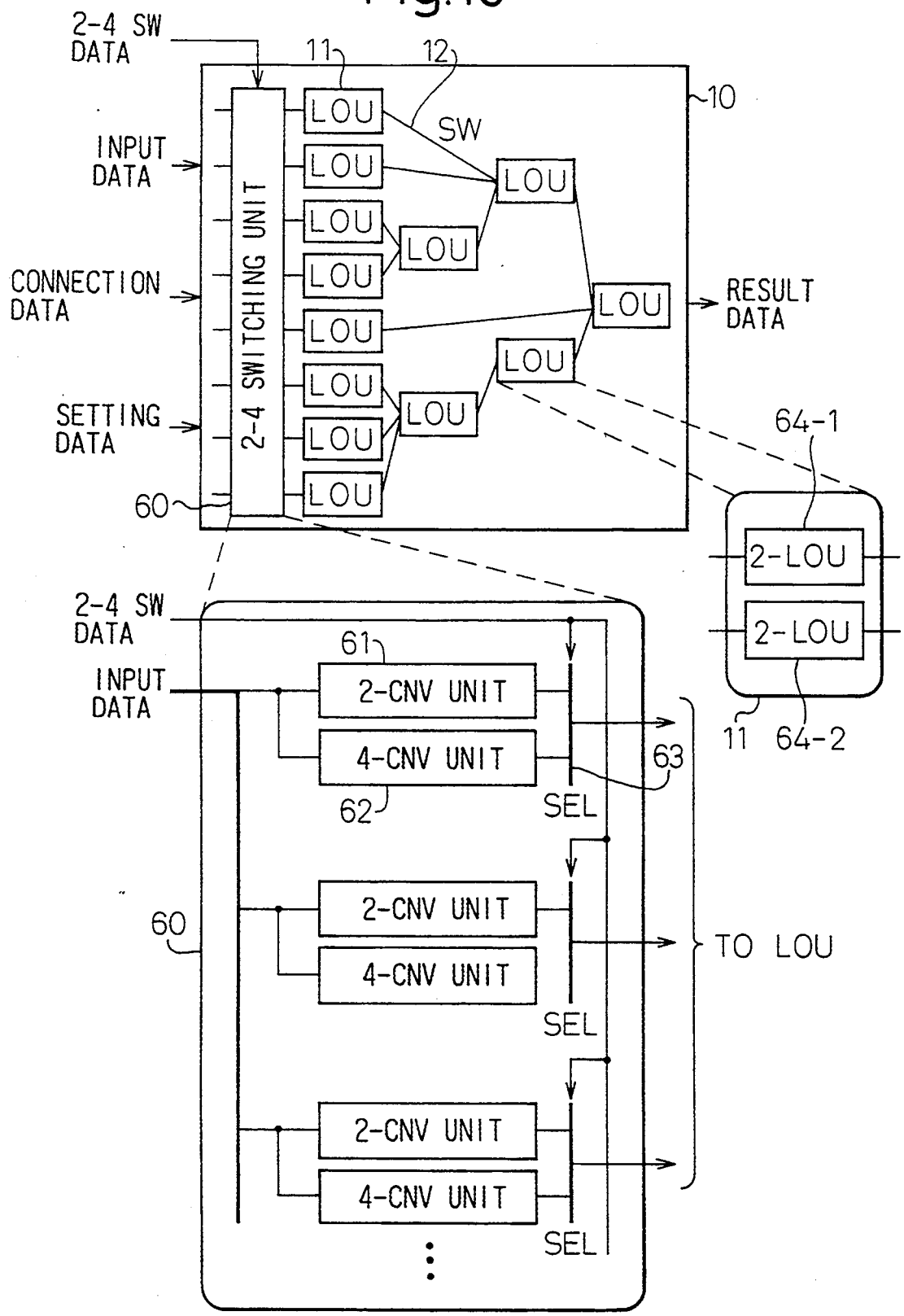
FIG. 10 shows one example of a basic structure of a binary/quaternary switching unit provided for the first stage of the logic operation unit shown in FIG. 5.

FIG. 10 is a basic structure of a binary/quaternary switching unit which is provided for the first stage of the logic operation unit. Reference number 60 denotes a binary/quaternary switching unit (2-4 SWITCHING UNIT). As shown by an enlarged view, the binary/quaternary switching unit 60 is formed of a plurality of sets of a binary input conversion unit (2-CNV UNIT) 61 and a quaternary input conversion unit (4-CNV UNIT) 62, and corresponding selectors (SEL) 63. The binary input conversion unit 61 receives the input data and converts it to binary data, and the quaternary input conversion unit 62 receives the input data and converts it to ternary and quaternary data. Further, the logic operation unit 11 is formed of binary logic operation units (2-LOU) 64-1 and 64-2 which are doubled. The doubled binary logic operation units 64-1 and 64-2 can perform binary, ternary, and quaternary logic operation.

In the binary/quaternary switching unit 60, the binary input conversion unit 61 or the quaternary input conversion unit 62 is selected by the binary/quaternary switching data (2-4 SW DATA) in the selector 63. The output of this unit 60 is provided to the corresponding logic operation unit 11.

Figure 11:
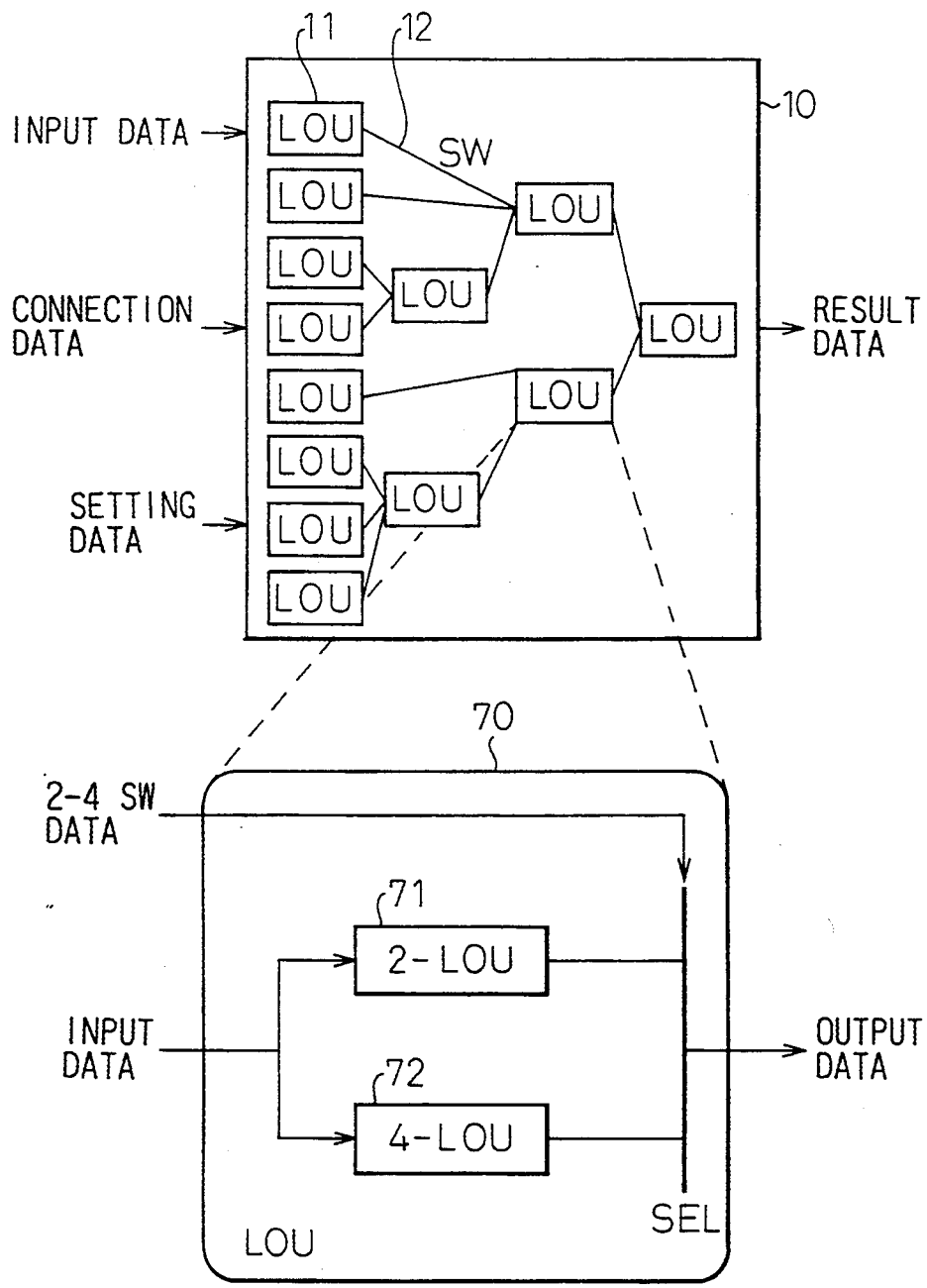
FIG. 11 is a schematic block diagram for explaining binary/quaternary logic operation according to the present invention.

FIG. 11 is a schematic block diagram for explaining binary/quaternary logic operation. As shown by an enlarged view, the logic operation unit 70 is formed of a binary logic operation unit (2-LOU) 71 and a quaternary logic operation unit (4-LOU) 72, and the selector SEL. The input data is provided to the binary logic operation unit 71 and the quaternary logic operation unit 72, and selected by the binary/quaternary switching data in the selector SEL.

Figure 12:
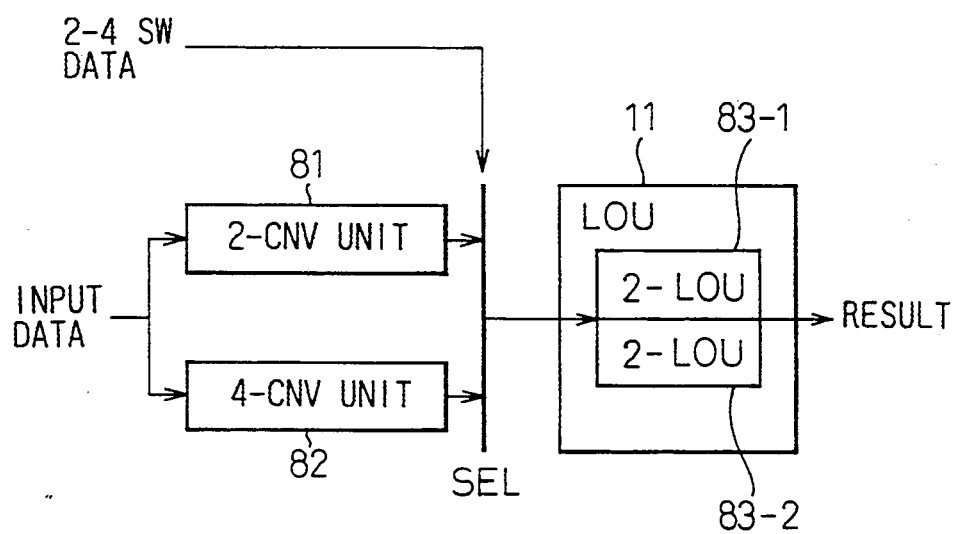
FIG. 12 is an explanatory view for a binary/quaternary operation in a binary logic operation unit.

FIG. 12 is an explanatory view of a binary/quaternary operation in the binary logic operation unit. The logic operation unit (LOU) 11 is formed of the doubled binary logic operation units 83-1 and 83-2. The binary input conversion unit 81 or the quaternary input conversion unit 82' is selected by the binary/quaternary switching data (2-4 SW DATA) in the selector 63, and the doubled binary logic units 83-1 and 83-2 perform the binary, ternary or quaternary logic operation.

Figure 13:
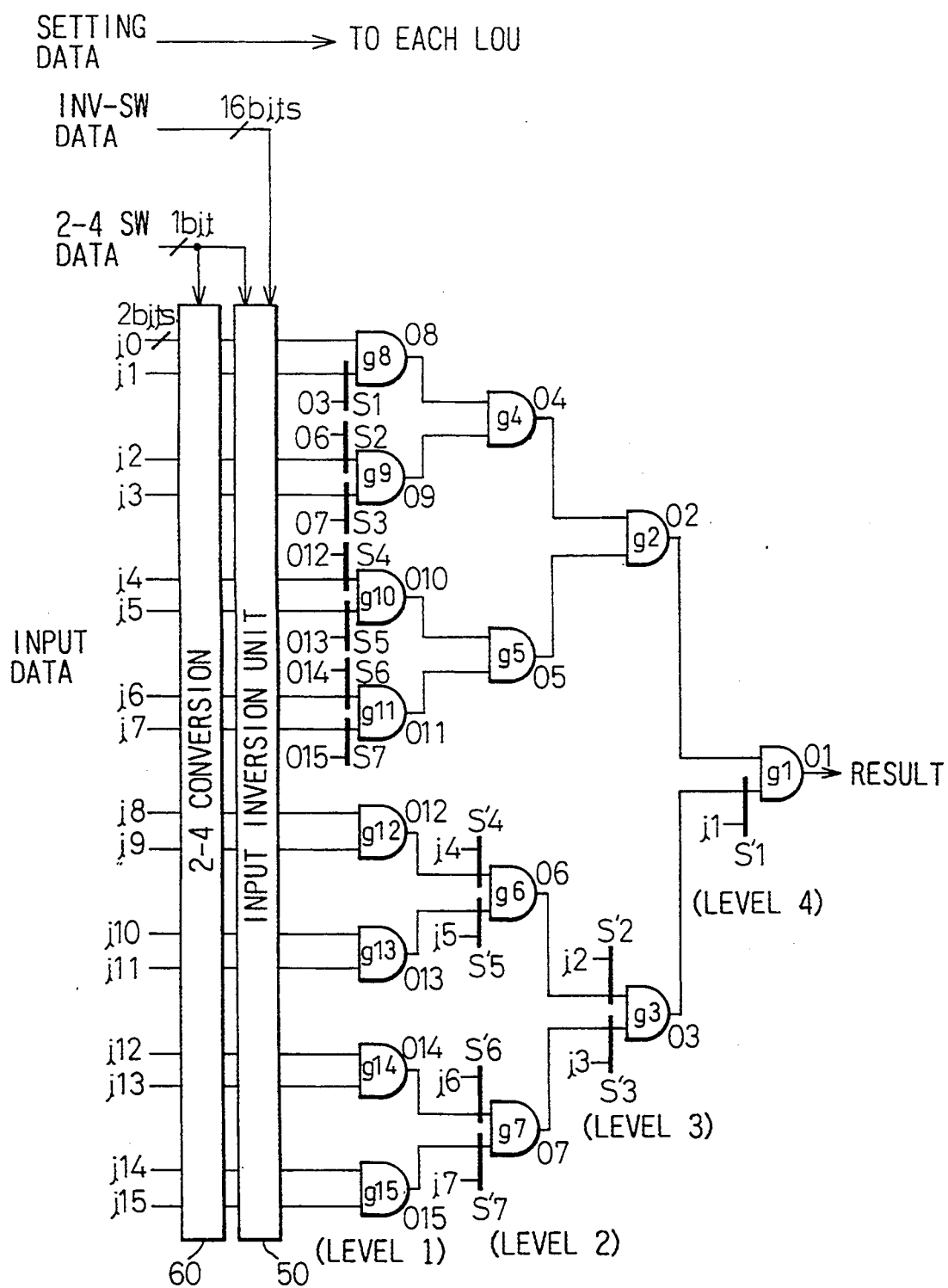
FIG. 13 is a schematic block diagram for a variable logic operation apparatus according to an embodiment of the present invention.

FIG. 13 is a schematic block diagram of a variable logic operation apparatus according to an embodiment of the present invention.

In FIG. 13, reference numbers g1 to g15 are logic operation units each of which is formed by an AND gate. Reference numbers i0 to i15 are input data each of which is binary, ternary or quaternary. The binary/quaternary conversion unit 60 performs the binary/quaternary conversion to the input data i0 to i15 in accordance with the binary/quaternary switching data (2-4 SW DATA) which is input from the external stage by one bit.

Further, the input inversion unit 50 inverts each input data i0 to i15 in accordance with the input inverting switching data (INV-SW DATA) which is input from the external stage. The switching data has sixteen bits, and each one bit (INV-SW DATA) is applied to the corresponding invertor as shown in FIG. 9. Reference numbers 01 to 015 denote outputs from the logic operation units g1 to g15.

A plurality of connection switches S1 to S7 and S'1 to S'7 are provided for switching connection of two input data in each logic operation unit. All switches are shown by turning OFF state in this drawing. For example, when the switches S1 and S'1 are turned OFF, the input of the logic operation unit g8 is "i0" and "i1", and the input of the logic operation unit g1 is "02" and "03". On the contrary, when the switches S1 and S'1 are turned ON, the input of the logic operation unit g8 is "i0" and "03", and the input of the logic operation unit g1 is "02" and "i1", respectively. Further, the logic function setting data are applied to the corresponding logic operation units g1 to g15.

Figure 14:
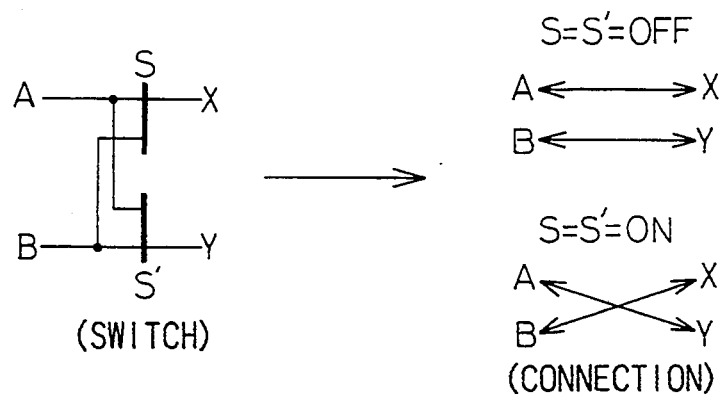
FIG. 14 is an explanatory view for one example of switch connection according to the present invention.

FIG. 14 is an explanatory view of the switch connection as one embodiment. As shown in the drawing, when the switches S and S' are turned OFF, the input A is connected to the output X, and the input B is connected to the output Y, respectively. On the contrary, when the switches S and S' are turned ON, the input A is connected to the output Y, and the input B is connected to the output X, respectively.

Figure 15:
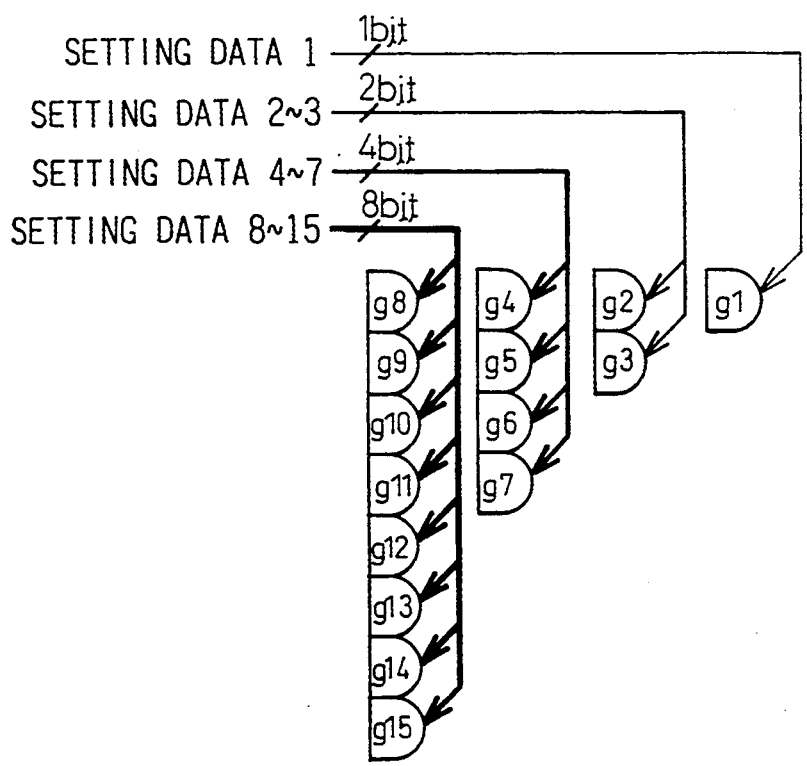
FIG. 15 is an explanatory view of the separate setting of logic function setting data according to the present invention.

FIG. 15 is an explanatory view of one example of the separate setting of the logic function setting data. As shown in the drawing, the logic function setting data 1 to 15 are assigned to the corresponding logic operation units g1 to g15. For example, the logic function setting data 1 (one bit) is applied to the logic operation unit g1, and the logical function setting data 8 to 15 (eight bits) are applied to the logic operation units g8 to g15, respectively. Accordingly, it is possible to separately perform the setting of the logic functions for each logic operation units g1 to g15.

Figure 16:
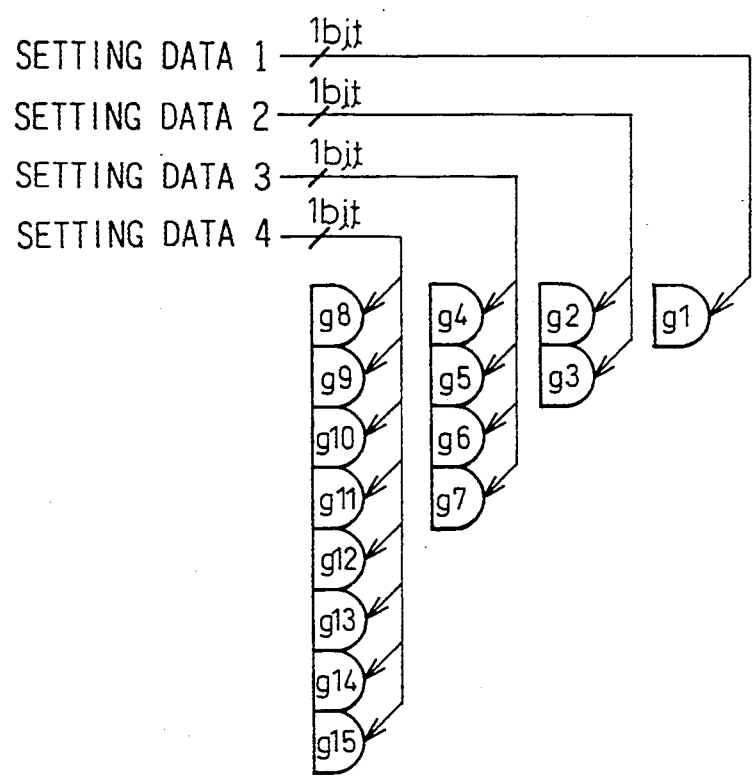
FIG. 16 is an explanatory view for another example of the separate setting of the logic function setting data.

FIG. 16 is an explanatory view of another example of the separate setting of the logic function setting data. In this case, the setting data 1 to 4 are assigned to each level of the tree structure. That is, the setting data 1 (one bit) is applied to the logic operation unit g1 (the fourth level of the tree structure), the setting data 2 (one bit) is applied to the logic operation units g2 and g3 (the third level of the tree structure), the setting data 3 (the second level) is applied to the logic operation units g4 to g7 (the second level of the tree structure), and the setting data 4 is applied to the logic operation units g8 to g15 (the first level of the tree structure). As shown in the drawing, this embodiment has an advantage in which the logic function setting data can be considerably reduced.

In two examples shown in FIGS. 15 and 16, although each logic function setting data is given by one bit, it may be possible to increase the number of bits in accordance with kinds of logical type to be realized.

Figure 17:
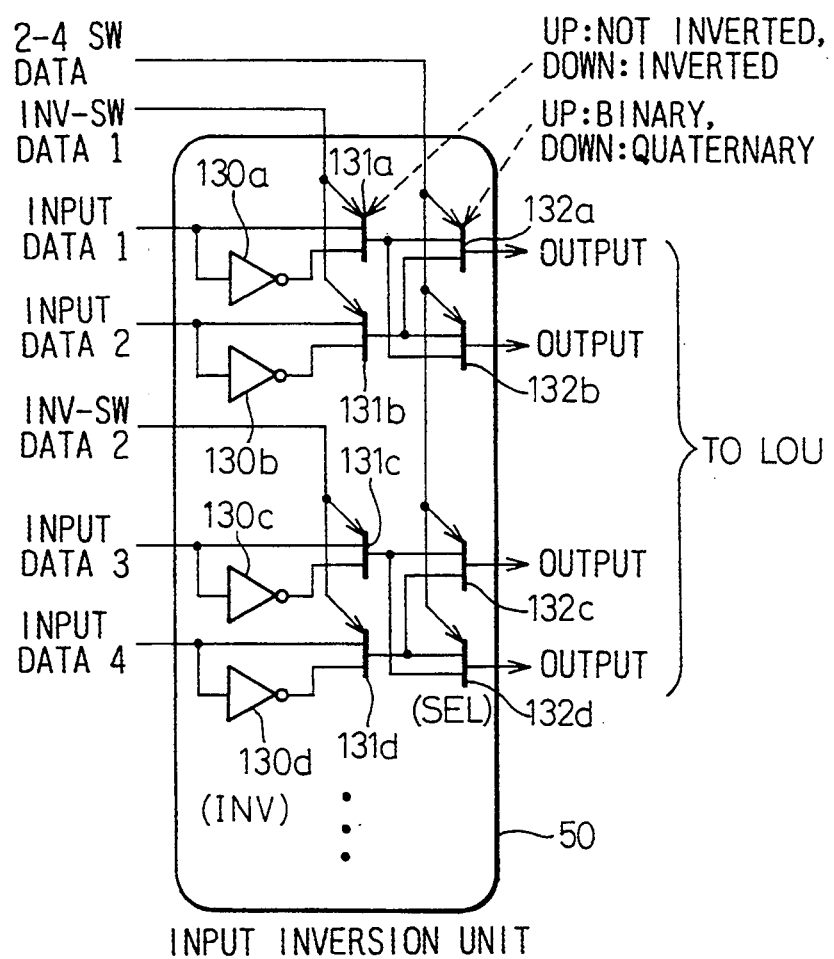
FIG. 17 shows one embodiment of the input inversion unit shown in FIG. 13.

FIG. 17 shows one embodiment of the input inversion unit shown in FIG. 13. In this drawing, reference numbers 130a to 130d denote invertors INV (for example, NOT gate) for inverting the input data between "0" (not inverted) and "1" (inverted). Reference numbers 131a to 131d denote first selection circuits (SEL) for selecting the non-inverted input data (an upper signal) when the input inverting/switching data (INV-SW DATA) is set to "0" (not inverted), and selecting the inverted input data (a lower signal) when the input inverting/switching data (INV-SW DATA) is set to "1" (inverted).

Reference numbers 132a to 132d denote second selection circuits (SEL) for selecting the upper signal when the binary/quaternary switching data (2-4 SW DATA) is set to "0" (binary), and selecting the lower signal when the binary/quaternary switching data (2-4 SW DATA) is set to "1" (ternary and quaternary). In this embodiment, the input data 1 to 4 are sent to the input inversion unit 50 through the binary/quaternary conversion unit 140 in FIG. 18.

In the binary operation, each binary value can be expressed by one bit "0" or "1". In the quaternary, each value of the quaternary "0", "1", "X" and "Z" can be expressed by two bits "00", "11", "01" and "10". Further, each value of the ternary "0", "1", and "X" can be expressed by two bits "00", "11", and "01" since the value "Z" is deleted in the ternary. In the logic simulation apparatus, in general, the value "X" denotes an unstable state, and the value "Z" denotes an open state (i.e., high impedance state).

FIG. 18 shows one embodiment of the binary/quaternary conversion unit. This embodiment shows the case of four input data. The binary/quaternary conversion unit 140 is used for the binary/quaternary switching unit 60 of FIG. 13. In the drawing, reference numbers 141 and 142 denote AND gates, reference numbers 143 and 144 denote OR gates, and reference numbers 145 to 148 denote selection circuits (SEL). This circuit 140 performs either binary conversion or quaternary conversion to the input data in accordance with the binary/quaternary switching data (2-4 SW ETA). The selection circuits 145 to 148 select directly the input data (the upper signal) when the binary/quaternary switching data (2-4 SW DATA) is "0" (i.e., binary), and selects the output of the AND or OR gates (the lower signal) when the binary/quaternary switching data (2-4 SW DATA) is "1" (i.e., the ternary or quaternary).

In the binary conversion, since the logic operation unit 11 is formed by two logic operation units which are doubled, the binary/quaternary conversion unit 140 performs the change of the order of the input data in order from the input data 1 to the input data (i.e., DATA1→DATA2→DATA3→DATA4). On the contrary, in the quaternary conversion, in order to correspond to the doubled logic operation unit 11, the binary/quaternary conversion unit 140 outputs the input data after conversion from the value "Z" to the value "X", i.e., conversion from "10" to "01".

Figures 19A, 19B, 19C, 19D, 19E:
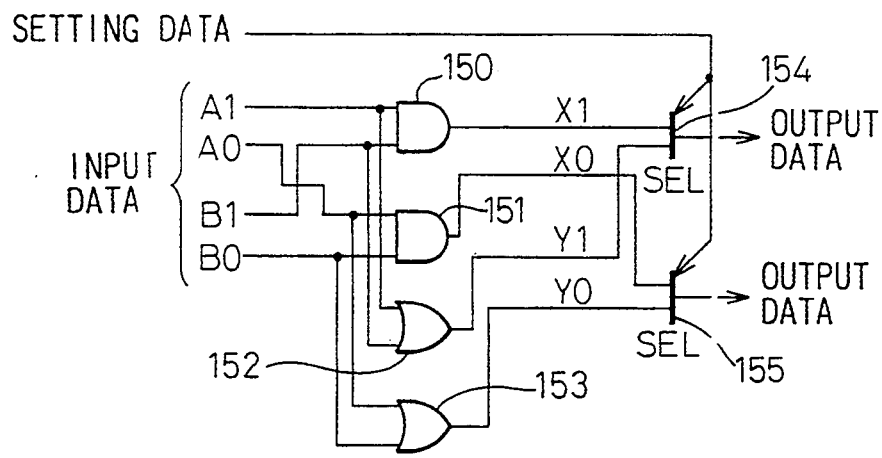
FIG. 19A shows one embodiment of the logic operation unit of FIG. 13.
FIGS. 19B to 19E are explanatory views of the relationship between input data and output data of FIG. 19A.

FIG. 19A shows one embodiment of the logic operation unit of FIG. 13, and FIGS. 19B to 19E are explanatory views of the relationship between the input data and the output data of FIG. 19A. In FIG. 19A, reference numbers 150 and 151 denote AND gates, reference numbers 152 and 153 denote OR gates, and reference numbers 154 and 155 denote selection circuits (SEL).

A0, A1, B0, and B1 denote the input data, and X0, X1, Y0, and Y1 denote outputs of the logic gates. The selection circuits. 154 and 155 select the upper signals X0 and X1 when the logic function setting data is "0", and select the lower signals Y0 and Y1 when the logic function setting data is "1" as explained detail below.

That is, the input data A1 and B1 are input to the AND gate 150, and the input data A0 and B0 are input to the AND gate 151. Further, the input data A1 and B1 are input to the OR gate 152, and the input data A0 and B0 are input to the OR gate 153. As explained above, when performing binary operation, one logic is expressed by one bit "0" or "1". When performing ternary/quaternary operation, one logic is expressed by two bits "00", "11", "01" and "10".

FIGS. 19B and 19C show the truth tables when the logic value is expressed by two bits. These truth tables show the relationship between the input data A0 to B1 and the output data X0 to Y1 when the logic value is expressed by two bits. In FIG. 19B, for example, when the input data A1 is "0" and A0 is "1" (this state is expressed by "X"), and input data B1 is "0" and B0 is "1" (this state is also expressed by "X"), the outputs X1 and X0 becomes "0" and "1" (this state is also expressed by "X"). In this case, when A1 is "1" and A0 is "0", and B1 is "1" and B0 is "0", this state is also expressed by "X" and the X1 and X0 becomes the same result "X".

In FIG. 19D, this truth table is simple. For example, when the value A is "1" and B is "0", the output "X" becomes "0".

Figure 20A:
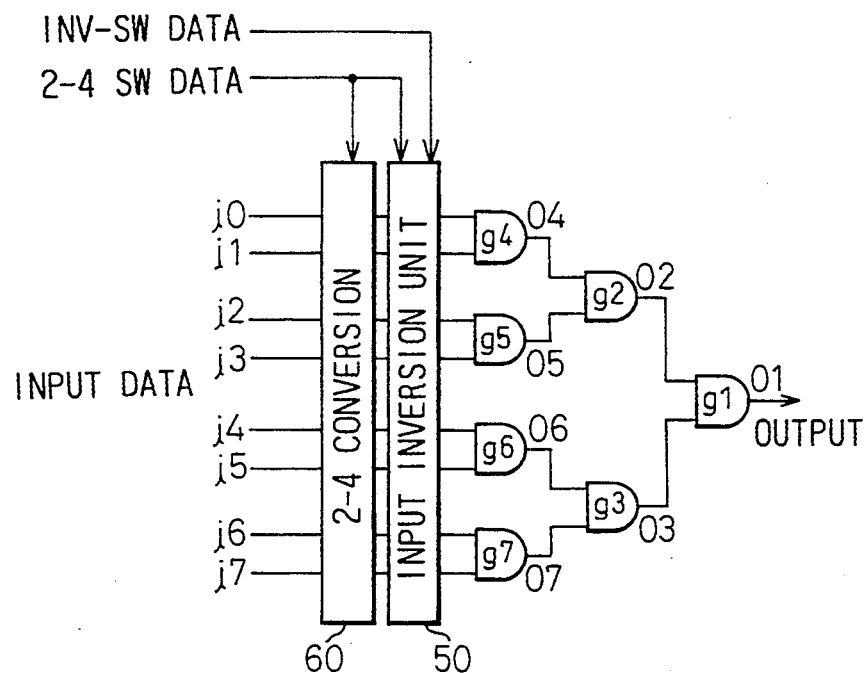
FIGS. 20A and 20B show one example of an operation method which selects outputs of the logic operation unit in the case that connections are fixed.
Figure 20B:
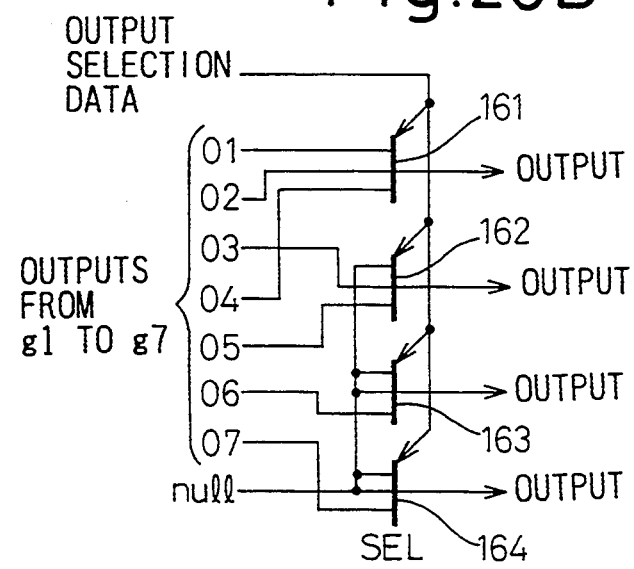

FIGS. 20A and 20B show one example of an operation method which selects the outputs of the logic operation unit in the case that the connections are fixed. In the drawing, reference number 60 denotes the binary/quaternary conversion unit, and 50 denotes the input inversion unit. It is assumed that the connection of the logic operation units g1 to g7 are fixed as shown in FIG. 20A. In FIG. 20B, 01 to 07 correspond to the outputs from the logic operation units g1 to g7.

That is, in FIG. 20B, output selection data is provided to the selection circuits 161 to 164. When the outputs 01 to 07 of the logic operation units g1 to g7 are applied to the selection circuits 161 to 164, the corresponding selection circuit selects the result of the logic operation in accordance with the output selection data. In this case, the selection circuits 162 to 164 can select a "null" signal which indicates an "invalid signal".

Figure 21:
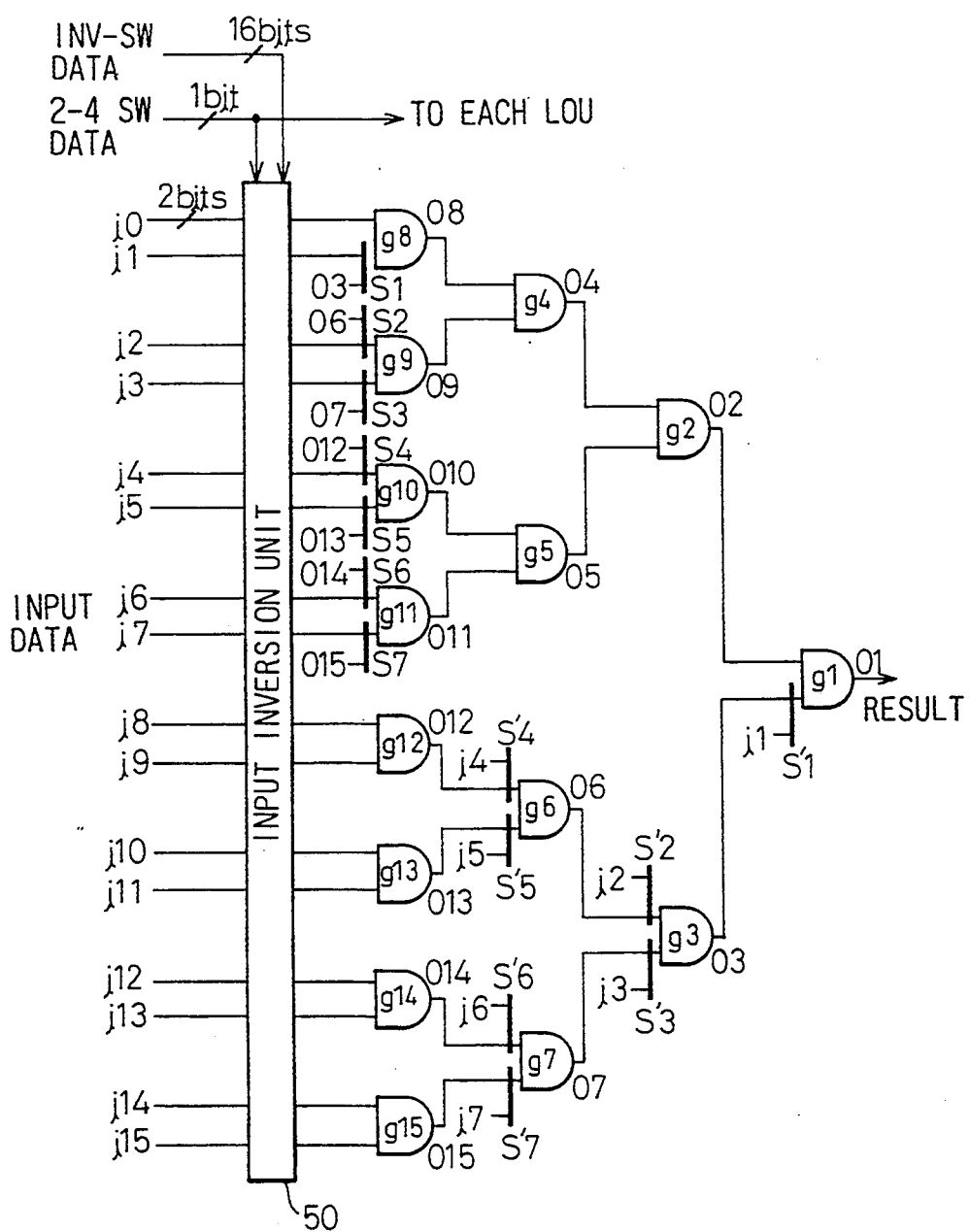
FIG. 21 shows one example of operation method which switches between the binary and quaternary within the logic operation unit.

FIG. 21 shows one example of an operation method which switches between the binary and the quaternary within the logic operation unit. Reference number 50 denotes the input inversion unit which inverts the input data. In this embodiment, the binary/quaternary switching signal is provided to the input inversion circuit 50 and each logic operation unit (LOU).

As explained in FIG. 13, the input data i0 to i15 are converted between the binary and quaternary in the binary/quaternary conversion unit 60 in accordance with the binary/quaternary switching signal (2-4 SW DATA) before the input data are provided to the logic operation units. In this embodiment, the binary/quaternary conversion unit is provided in the logic operation units g1 to g15 so that it is possible to reduce the amount of hardware.

Figure 22:
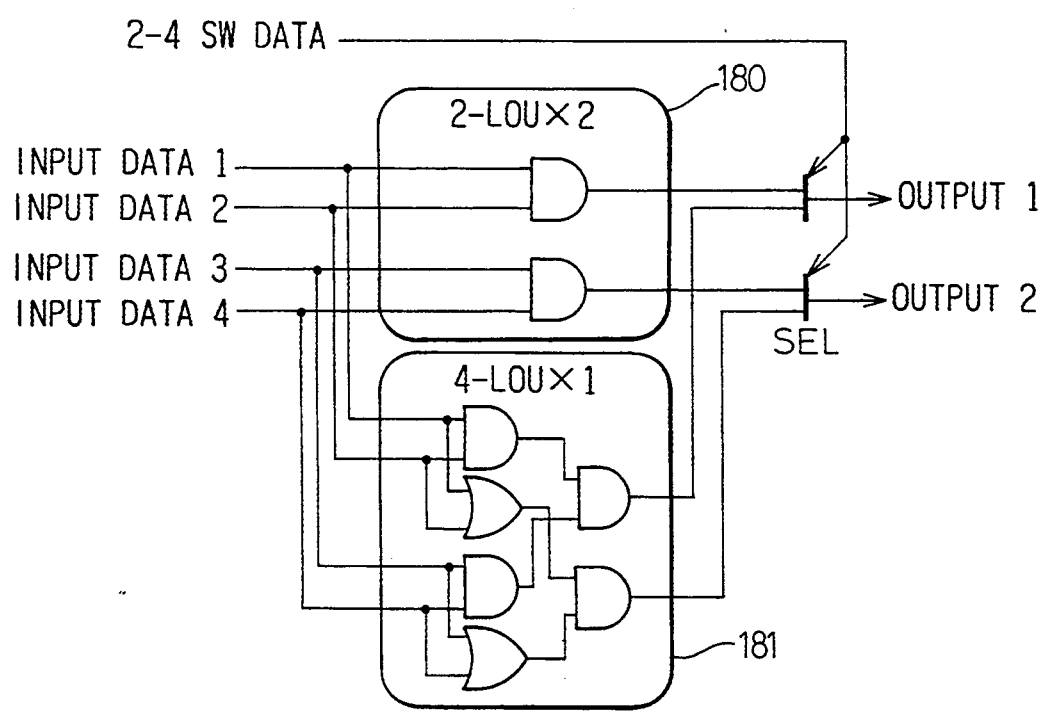
FIG. 22 shows one example of detailed block diagram of the logic operation unit shown in FIG. 21.

FIG. 22 shows one example of detailed block diagram of the logic operation unit shown in FIG. 21. In this embodiment, reference number 180 denotes the binary logic operation unit (2-LOU×2) which is formed of two AND gates (i.e., this unit is formed by two binary operators). Further, reference number 181 denotes the quaternary logic operation unit (4-LOU×1) which is formed by two OR gates and four AND gates.

The input data 1 to 4 (i.e., 4 bits) are input in parallel to the binary logic operation unit 180 and the quaternary logic operation unit 181. When performing the binary operation, this circuit can realize double literal numbers of the quaternary operation. Further, this circuit can selectively output either the output 1 of the binary logic operation unit 180 or the output 2 of the quaternary logic operation unit 181 in accordance with the binary/quaternary switching data (2-4 SW DATA).

Figure 23:
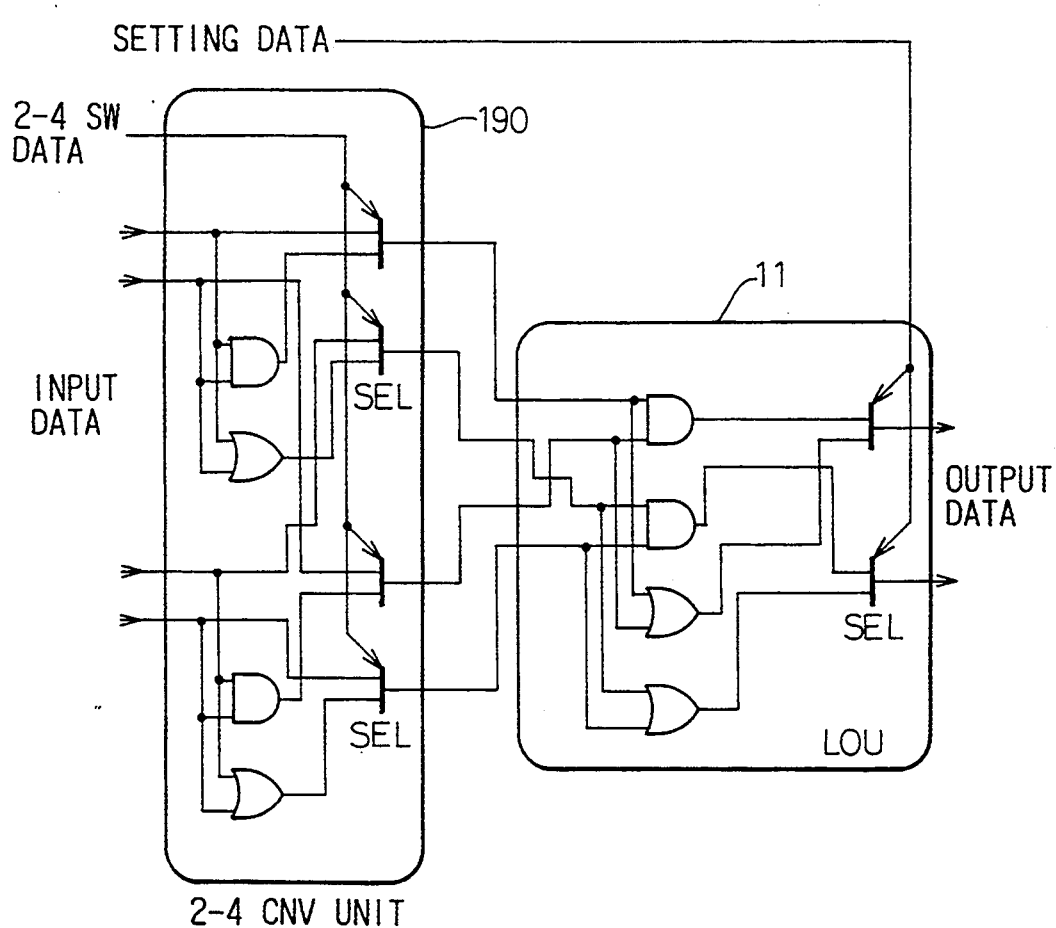
FIG. 23 shows one example of the operation method which performs binary, ternary and quaternary operations in the logic operation unit which is doubled.

FIG. 23 shows one example of the operation method which performs binary, ternary and quaternary operations in the logic operation unit which is doubled. Reference number 190 denotes the binary/quaternary conversion unit. As shown in the drawing, the logic operation unit 11 has two logic units which are formed of two AND gates and two OR gates (i.e., doubled binary logic unit), and this structure is determined by the selection units (SEL) in accordance with the logic function setting data. The binary/quaternary conversion unit 190 determines ether these input data should be processed by the binary operation or by the quaternary operation in accordance with the binary/quaternary switching data.

We claim:

1. A variable logic operation apparatus which receives n-nary input data, logic function setting data and connection data, and performs logic operations on the input data based on a logic expression, the apparatus comprising:
a plurality of logic operation units, each logic operation unit selecting a respective logic operation from a group comprising at least one logic operation, and outputting a single result based on the selected logic operation, the selected logic operation being selected by the logic function setting data; and
a plurality of connection devices which connect the plurality of logic operation units in accordance with the connection data to form a tree structure, the tree structure being changeable by changing the connection data and the logic expression being converted into the tree structure in accordance with the setting data and the connection data 2. A variable logic operation apparatus as claimed in claim 1, wherein connections among the plurality of logic operation units are limited prior to forming the tree structure, and only necessary connections are changeable to form the tree structure by changing the connection data.

3. A variable logic operation apparatus as claimed in claim 1, wherein the logic operation units are connected to form tree structure which is fixed, and outputs of at least one of the plurality of logic operation units are selected to obtain a desired result of the logic expression in accordance with the connection data.

4. A variable logic operation apparatus as claimed in claim 2, wherein the logic operation units are connected to form tree structure which is fixed, and outputs of at least one of the plurality of logic operation units are selected to obtain a desired result of the logic expression in accordance with the connection data.

5. A variable logic operation apparatus as claimed in claim 1, wherein the logic function setting data is separately applied to each logic operation unit so that the logic function of each logic operation unit is separately determined in accordance with the setting data.

6. A variable logic operation apparatus as claimed in claim 2, wherein the logic function setting data is separately applied to each logic operation unit so that the logic function of each logic operation unit is separately determined in accordance with the setting data.

7. A variable logic operation apparatus as claimed in claim 3, wherein the logic function setting data is separately applied to each logic operation unit so that the logic function of each logic operation unit is separately determined in accordance with the setting data.

8. A variable logic operation apparatus as claimed in claim 1, wherein the tree structure has a plurality of levels and the logic function setting data is applied for every level of the tree structure so that the logic function of each logic operation unit is determined for every level of the tree structure in accordance with tile setting data.

9. A variable logic operation apparatus as claimed in claim 2, wherein the tree structure has a plurality of levels and the logic function setting data is applied for every level of the tree structure so that the logic function of each logic operation unit is determined for every level of the tree structure in accordance with the setting data.

10. A variable logic operation apparatus as claimed in claim 3, wherein the tree structure has a plurality of levels and the logic function setting data is applied for every level of the tree structure so that the logic function of each logic operation unit is determined for every level of the tree structure in accordance with the setting data.

11. A variable logic operation apparatus as claimed in claim 1, wherein the variable logic operation apparatus receives input inverting/switching data and the tree structure forms an input stage of logic operation units which receive the input data, the variable logic operation apparatus further comprising an input inversion means for inverting the input data in accordance with the input inverting/switching data before the input data is received by the logic operation units of the input stage.

12. A variable logic operation apparatus as claimed in claim 1, wherein the variable logic operation apparatus receives binary/quaternary switching data and the tree structure forms an input stage of logic operation units which receive the input data, the variable logic operation apparatus further comprising a binary/quaternary conversion means for converting the input data between the binary and quaternary in accordance with the binary/quaternary switching data before the input data is received by the logic operation units of the input stage.

13. A variable logic operation apparatus as claimed in claim 12, wherein the binary/quaternary conversion means comprises a plurality of sets of conversion units, each set of conversion units receiving the input data and comprising a binary conversion unit and a quaternary conversion unit.

14. A variable logic operation apparatus as claimed in claim 12, wherein the logic operation units each comprise two binary logic operation units which are doubled.

15. A variable logic operation apparatus as claimed in claim 1, wherein the logic operation units each comprise a binary operation unit and a quaternary operation unit.

16. A variable logic operation apparatus as claimed in claim 1, wherein the variable logic operation apparatus receives binary/quaternary switching data and input inverting/switching data and the tree structure forms an input stage of logic operation units which receive the input data, the variable logic operation apparatus further comprising:
a binary/quaternary conversion means for converting the input data between the binary and quaternary in accordance with the binary/quaternary switching data and producing binary/quaternary output data; and
input inversion means for receiving the binary/quaternary output data from the binary/quaternary conversion means, inverting the binary/quaternary output data in accordance with the input inverting/switching data to produce a corresponding output, and supplying the output to the logic operation units of the input stage.

17. A variable logic operation apparatus as claimed in claim 1, wherein each logic operation unit comprises:
an AND operation unit which performs a logical AND operation and produces a corresponding output;
an OR operation unit which performs a logical OR operation and produces a corresponding output; and
a selection unit which receives the output of the AND operation unit and the output of the OR operation unit and selects one of the output of the AND operation unit and the output of the OR operation unit in accordance with the setting data.

18. A variable logic operation apparatus as claimed in claim 11, wherein the input inversion means comprises a plurality of invertor-selector sets which each receive respective input data and comprise:
an invertor which receives the respective input data and produces an inverted output, and
a selector which receives the respective input data and the inverted output from the inverter and selects one of the respective input data and the inverted output in accordance with the input inverting/switching data.

19. A variable logic operation apparatus as claimed in claim 12, wherein the binary/quaternary conversion means comprises a plurality of binary-quaternary sets, each set comprising:
a binary input conversion unit which receives the input data and produces a binary converted output,
a quaternary input conversion unit which receives the input data and produces a quaternary converted output, and
a selection unit which receives the binary converted output of the binary input conversion unit and the quaternary converted output of the quaternary input conversion unit and selects one of the binary converted output and the quaternary converted output in accordance with the binary/quaternary switching data.

20. A variable logic operation apparatus as claimed in claim 1, wherein the variable logic operation apparatus receives binary/quaternary switching data and each logic operation unit comprises:
- a binary operation unit which performs a binary operation and produces a corresponding output;
- a quaternary operation unit which performs a quaternary operation and produces a corresponding output; and
- a selector which receives the output of the binary operation unit and the output of the quaternary operation unit and selects one of the output of the binary operation unit and the output of the quaternary operation unit in accordance with the binary/quaternary switching data.

21. A variable logic operation apparatus as claimed in claim 1, wherein each logic operation unit comprises a set of binary logic operation units which are doubled and the variable logic operation apparatus further comprising:
- a binary input conversion unit which receives the input data and produces a binary converted output;
- a quaternary input conversion unit which receives the input data and produces a quaternary converted output;
- a selector which receives the output of the binary converted output and the quaternary converted output and selects one of the binary converted output and the quaternary converted output and provides the selected binary converted output or quaternary converted output to a respective logic operation unit.

22. A variable logic operation apparatus as claimed in claim 1, wherein the input data is one of binary, ternary or quaternary input data.

* * * * *

UNITED STATES PATENT AND TRADEMARK OFFICE
CERTIFICATE OF CORRECTION

PATENT NO. : 5,424,734
DATED : June 13, 1995
INVENTOR(S) : Kioto HIRAHARA et al.

It is certified that error appears in the above-indentified patent and that said Letters Patent is hereby corrected as shown below:

Column 6, line 1, "In second" should read —In the second—.

Column 6, line 2, "the valid" should be --valid--.

Column 8, line 50, "ETA" should be --DATA--.

Column 10, line 30, "ether" should be --whether--.

line 61, "form" should be --form a--.

line 67, "form" should be --form a--.

Column 11, line 23, "tile" should be --the--.

Column 12, line 19, "input" should be --an input--.

Signed and Sealed this

Seventh Day of November, 1995

Attest:

BRUCE LEHMAN

*Attesting Officer*     *Commissioner of Patents and Trademarks*